United States Patent
Jin et al.

(10) Patent No.: US 11,148,969 B2
(45) Date of Patent: Oct. 19, 2021

(54) PATTERNED GLASS ARTICLES AND METHODS OF MAKING THE SAME

(71) Applicant: CORNING INCORPORATED, Corning, NY (US)

(72) Inventors: Yuhui Jin, Painted Post, NY (US); Aize Li, Painted Post, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 16/574,703

(22) Filed: Sep. 18, 2019

(65) Prior Publication Data

US 2020/0095160 A1 Mar. 26, 2020

Related U.S. Application Data

(60) Provisional application No. 62/734,457, filed on Sep. 21, 2018.

(51) Int. Cl.
| | |
|---|---|
| *B32B 3/00* | (2006.01) |
| *C03C 15/00* | (2006.01) |
| *C03C 21/00* | (2006.01) |
| *H05K 5/00* | (2006.01) |
| *H05K 5/02* | (2006.01) |
| *H05K 5/03* | (2006.01) |

(52) U.S. Cl.
CPC .............. *C03C 15/00* (2013.01); *B32B 3/00* (2013.01); *C03C 21/002* (2013.01); *H05K 5/0017* (2013.01); *H05K 5/0243* (2013.01); *H05K 5/03* (2013.01); *Y10T 428/24802* (2015.01)

(58) Field of Classification Search
CPC ....... H05K 5/03; H05K 5/0017; H05K 5/0243
See application file for complete search history.

(56) References Cited

U.S. PATENT DOCUMENTS

| 6,678,453 B2 | 1/2004 | Bellman et al. |
|---|---|---|
| 2002/0058463 A1 | 5/2002 | Kurachi et al. |
| 2016/0362331 A1 | 12/2016 | Castle et al. |

(Continued)

FOREIGN PATENT DOCUMENTS

| CN | 1807316 A | 7/2006 |
|---|---|---|
| KR | 1354579 B1 | 1/2014 |

(Continued)

OTHER PUBLICATIONS

International Search Report and Written Opinion of the European International Searching Authority; PCT/US2019/051373; dated Nov. 27, 2019; 12 Pgs.

*Primary Examiner* — Elizabeth E Mulvaney

(74) *Attorney, Agent, or Firm* — John P. McGroarty; Timothy M. Schaeberle

(57) ABSTRACT

A patterned glass article that includes: a glass substrate comprising a thickness, a primary surface and a bulk composition at the midpoint of the thickness; and a patterned region defined by the primary surface and comprising a patterned region composition. The bulk composition comprises about 40 mol % to 80 mol % silica and the patterned region composition comprises at least about 40 mol % silica. Further, the patterned region comprises a first textured region and a second textured region, the second textured region characterized by a haze of at least 5% more than a haze of the first textured region.

18 Claims, 8 Drawing Sheets

(56) References Cited

U.S. PATENT DOCUMENTS

2016/0376186 A1* 12/2016 Gross .................... G06F 1/1637
                                                      361/679.26
2017/0300114 A1* 10/2017 Matsuyuki .............. G06F 3/016
2018/0282201 A1   10/2018 Hancock, Jr. et al.

FOREIGN PATENT DOCUMENTS

| KR | 1594877 B1 | 2/2016 |
| WO | 2016040151 A1 | 3/2016 |
| WO | 2018182996 A1 | 10/2018 |
| WO | 2019055745 A1 | 3/2019 |

* cited by examiner

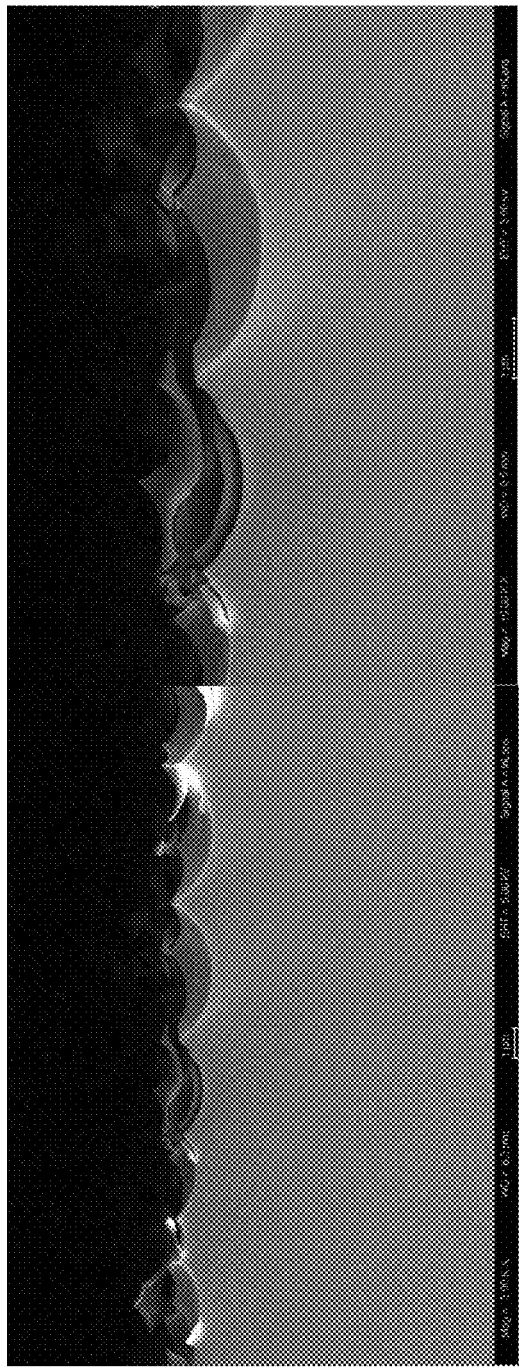
FIG. 6A1
FIG. 6A2
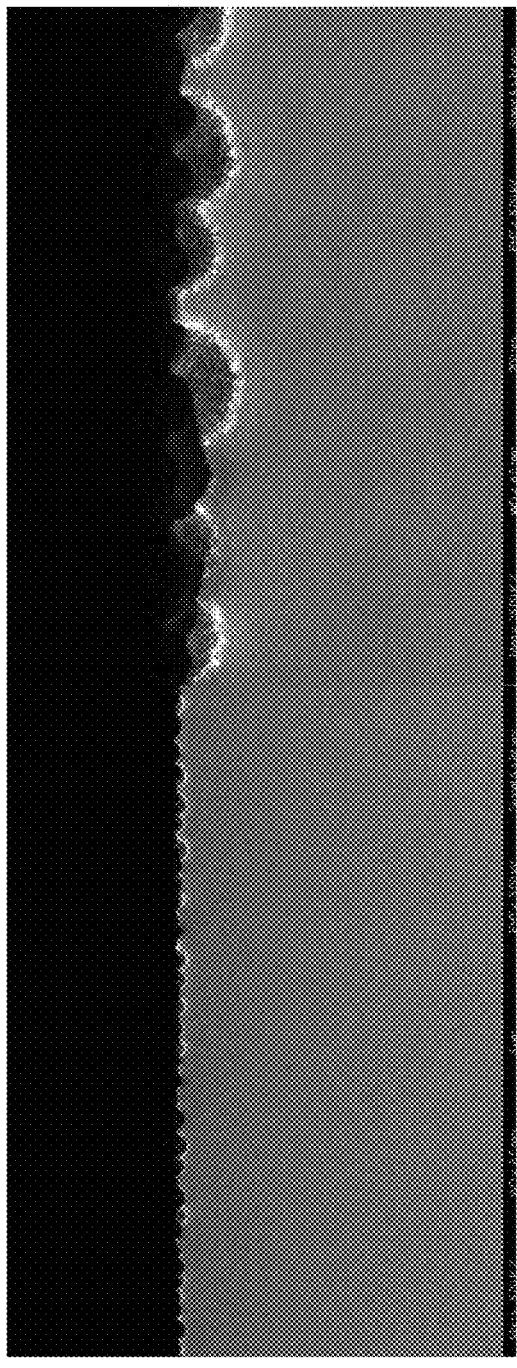
FIG. 6B1
FIG. 6B2

PATTERNED GLASS ARTICLES AND METHODS OF MAKING THE SAME

CROSS-REFERENCE TO RELATED APPLICATIONS

This application claims the benefit of priority under 35 U.S.C. § 119 of U.S. Provisional Application Ser. No. 62/734,457 filed on Sep. 21, 2018, the content of which is relied upon and incorporated herein by reference in its entirety.

FIELD

The present disclosure generally relates to patterned glass articles and methods of making the same, particularly hydrofluoric acid-free methods to produce substantially patterned glass articles for covers, housings and enclosures of electronic devices.

BACKGROUND

Textured glass surfaces (e.g., a glass surface with a uniform or substantially uniform surface roughness) have been employed in particular applications that employ glass substrates. The texturing of these glass surfaces can provide desired aesthetic and/or tactile effects, depending on the desired or required attributes of the application employing the glass substrate with the textured surface. These applications can include glass covers for electronic devices, including smart-phone devices, tablet computers, computer displays, electronic picture frames and other display devices. Other applications employing patterned glass surfaces include glass substrates used in counters and other architectural articles of residential and commercial dwellings.

Conventional approaches to making textured glass surfaces suffer from the use of treatments that employ aggressive acids, such as hydrofluoric acid, that are not considered environmentally friendly and costly to employ in manufacturing. Still further, conventional approaches to texturing glass for roughened surfaces often result in relatively large features which can limit the effectiveness of these surfaces in producing the desired aesthetic and/or tactile effects. In addition, conventional approaches for texturing glass substrates to develop textured surfaces are often able to produce uniform, or substantially uniform, degrees of surface roughness; however, these processes can be limited in the sense that the aesthetic and/or tactile effect of the textured surfaces generated from the process is limited to a constant or substantially constant degree of surface roughness across the full surface of the textured glass article.

In view of these considerations, there is a need for patterned and/or textured glass articles, particularly hydrofluoric acid-free methods to produce patterned and textured glass articles. There is also a need for processes to develop glass substrates with surfaces having varying degrees of surface roughness, e.g., to allow for the development of patterns and other aesthetic and/or tactile features of benefit to the applications that employ such glass substrates. Further, there is a need for such methods in a form amenable to manufacturing at low cost and high throughput.

SUMMARY

A first aspect of this disclosure pertains to a patterned glass article that includes: a glass substrate comprising a thickness, a primary surface and a bulk composition at the midpoint of the thickness; and a patterned region defined by the primary surface and comprising a patterned region composition. The bulk composition comprises about 40 mol % to 80 mol % silica and the patterned region composition comprises at least about 40 mol % silica. Further, the patterned region comprises a first textured region and a second textured region, the second textured region characterized by a haze of at least 5% more than a haze of the first textured region.

A second aspect of the disclosure pertains to a patterned glass article that includes: a glass substrate comprising a thickness, a primary surface and a bulk composition at the midpoint of the thickness; and a patterned region defined by the primary surface and comprising a patterned region composition. The bulk composition comprises about 40 mol % to 80 mol % silica and the patterned region composition comprises at least about 40 mol % silica. Further, the patterned region comprises a first textured region and a second textured region, the second textured region characterized by a haze of at least 5% more than a haze of the first textured region. In addition, the patterned region comprises a plurality of exposed features having an average maximum dimension from about 0.01 microns to about 100 microns in a plane defined by the primary surface.

In a third aspect according to the first or second aspect, the patterned region further comprises a surface roughness ($R_a$) from about 10 nanometers to about 500 nanometers.

In a fourth aspect according to any one of the preceding aspects, the bulk composition is selected from the group consisting of an aluminosilicate glass, a borosilicate glass, and a phosphosilicate glass.

In a fifth aspect according to any one of the preceding aspects, the glass substrate further comprises a compressive stress region that extends from the primary surface to a selected depth.

In a sixth aspect according to any one of the preceding aspects, the second textured region is characterized by a haze of at least 15% more than a haze of the first textured region.

In a seventh aspect according to any one of the first through the fifth aspects, the second textured region is characterized by a haze of at least 30% more than a haze of the first textured region.

In an eighth aspect according to any one of the first through the fifth aspects, the second textured region is characterized by a haze of at least 45% more than a haze of the first textured region.

In a ninth aspect according to the second aspect, the patterned region comprises a plurality of exposed features having an average maximum dimension from about 0.01 microns to about 10 microns in a plane defined by the primary surface.

A tenth aspect of the disclosure pertains to a consumer electronic product including a housing having a front surface, a back surface and side surfaces; electrical components provided at least partially within the housing, the electrical components including at least a controller, a memory, and a display, the display being provided at or adjacent the front surface of the housing; and a cover glass disposed over the display, wherein at least one of a portion of the housing or the cover glass comprises the article of any one of the preceding aspects.

An eleventh aspect of the disclosure pertains to a method of making a patterned glass article including the steps: etching an initial primary surface of a glass substrate having a thickness with a hydrofluoric acid-free etchant having a pH of about 3 or less; and removing the etchant from the glass substrate. The etching is conducted from above ambient temperature to about 110° C. to form an etched surface that is defined by a primary surface of the substrate. The method also includes the steps: masking a portion of the etched surface with a mask to define a masked surface; treating the masked surface with a second etchant having a pH of about 10.0 or greater at above ambient temperature to define a patterned region, the patterned region comprise a first textured region and a second textured region; and removing the second etchant and the mask. Further, the glass substrate comprises a bulk composition at the midpoint of the thickness comprising about 40 mol % to 80 mol % silica and the patterned region comprises a patterned region composition comprising at least about 40 mol % silica. In addition, the second textured region is characterized by a haze of at least 5% more than a haze of the first textured region.

In a twelfth aspect according to the eleventh aspect, the etching step comprises etching the initial primary surface of the glass substrate having a thickness with a hydrofluoric acid-free etchant having a pH of about 3 or less and an additive salt.

In a thirteenth aspect according to the twelfth aspect, the additive salt comprises one or more cations selected from the group consisting of $NH_4^+$, $Al^{3+}$, $Fe^{3+}$, $Ca^{2+}$ and $Mg^{2+}$.

In a fourteenth aspect according to the twelfth aspect or the thirteenth aspect, the etching step is conducted such that the temperature is from about 90° C. to about 110° C. and the concentration of the additive salt ranges from greater than 0.1M to about 1.5M.

In a fifteenth aspect according to any one of the eleventh through the fourteenth aspects, the masking step is conducted with an inkjet printing process.

In a sixteenth aspect according to any one of the eleventh through the fifteenth aspects, the etchant is about 20 wt. % citric acid, the additive salt is 1M $AlCl_3$, and the second etchant is 4 wt % KOH.

In a seventeenth aspect according to any one of the eleventh through the sixteenth aspects, the second textured region is characterized by a haze of at least 15% more than a haze of the first textured region.

In a seventeenth aspect according to any one of the eleventh through the seventeenth aspects, the second textured region is characterized by a haze of at least 30% more than a haze of the first textured region.

In an eighteenth aspect according to any one of the eleventh through the seventeenth aspects, the second textured region is characterized by a haze of at least 45% more than a haze of the first textured region.

Additional features and advantages will be set forth in the detailed description which follows, and will be readily apparent to those skilled in the art from that description or recognized by practicing the embodiments as described herein, including the detailed description which follows, the claims, as well as the appended drawings.

It is to be understood that both the foregoing general description and the following detailed description are merely exemplary, and are intended to provide an overview or framework to understanding the nature and character of the disclosure as it is claimed.

The accompanying drawings are included to provide a further understanding of principles of the disclosure, and are incorporated in, and constitute a part of, this specification. The drawings illustrate one or more embodiment(s) and, together with the description, serve to explain, by way of example, principles and operation of the disclosure. It is to be understood that various features of the disclosure disclosed in this specification and in the drawings can be used in any and all combinations. By way of non-limiting examples, the various features of the disclosure may be combined with one another according to the following aspects.

BRIEF DESCRIPTION OF THE DRAWINGS

These and other features, aspects and advantages of the present disclosure are better understood when the following detailed description of the disclosure is read with reference to the accompanying drawings, in which:

FIGS. 6A1 and 6A2 are scanning electron microscope (SEM) micrographs of the non-masked surface of the patterned glass article depicted in FIG. 6 at two magnification levels.

FIGS. 6B1 and 6B2 are SEM micrographs of the masked surface of the patterned glass article depicted in FIG. 6 at two magnification levels.

DETAILED DESCRIPTION

Figure 1:
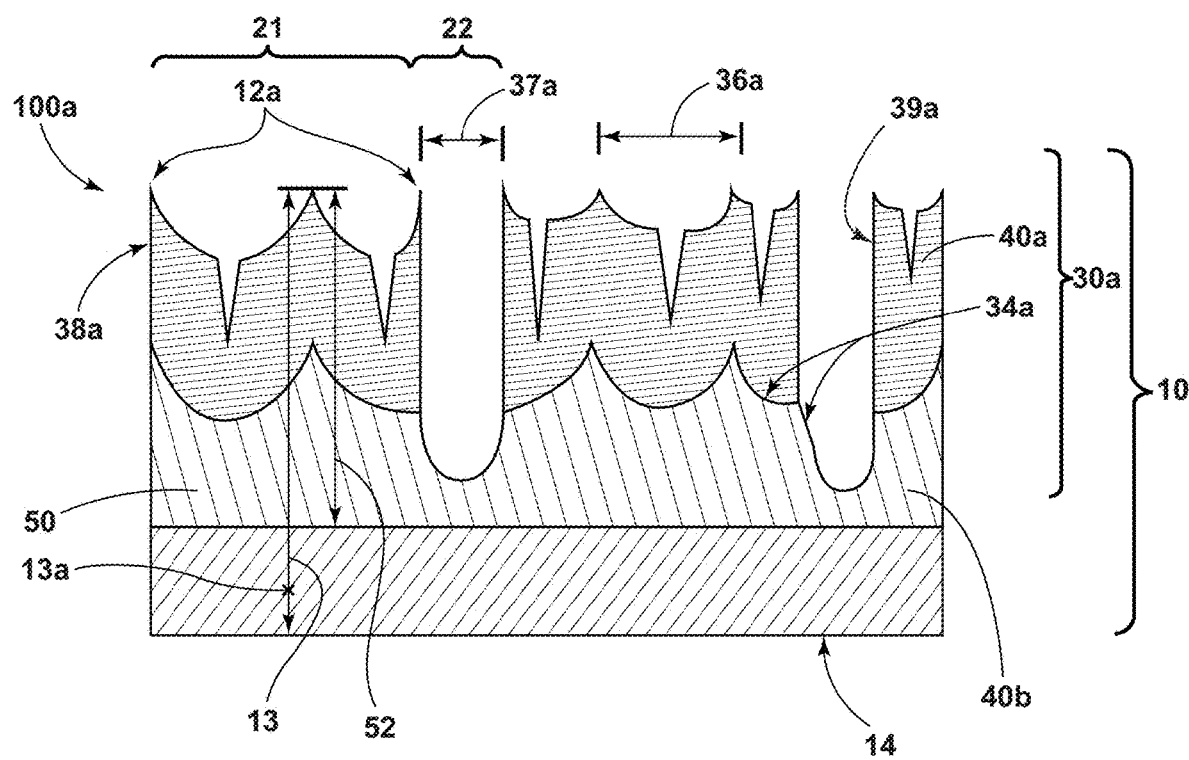
FIG. 1 is a cross-sectional, schematic view of a patterned glass article with a patterned region that comprises a first textured region and a second textured region, according to an aspect of the disclosure.

In the following detailed description, for purposes of explanation and not limitation, example embodiments disclosing specific details are set forth to provide a thorough understanding of various principles of the present disclosure. However, it will be apparent to one having ordinary skill in the art, having had the benefit of the present disclosure, that the present disclosure may be practiced in other embodiments that depart from the specific details disclosed herein. Moreover, descriptions of well-known devices, methods and materials may be omitted so as not to obscure the description of various principles of the present disclosure. Finally, wherever applicable, like reference numerals refer to like elements.

Ranges can be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint.

Directional terms as used herein—for example up, down, right, left, front, back, top, bottom—are made only with reference to the figures as drawn and are not intended to imply absolute orientation.

Unless otherwise expressly stated, it is in no way intended that any method set forth herein be construed as requiring that its steps be performed in a specific order. Accordingly, where a method claim does not actually recite an order to be followed by its steps, or it is not otherwise specifically stated in the claims or descriptions that the steps are to be limited to a specific order, it is in no way intended that an order be inferred, in any respect. This holds for any possible non-express basis for interpretation, including: matters of logic with respect to arrangement of steps or operational flow; plain meaning derived from grammatical organization or punctuation; the number or type of embodiments described in the specification.

As used herein, the singular forms "a," "an" and "the" include plural referents unless the context clearly dictates otherwise. Thus, for example, reference to a "component" includes aspects having two or more such components, unless the context clearly indicates otherwise.

Aspects of the disclosure generally pertain to patterned glass articles and methods of making the same, particularly hydrofluoric acid-free methods to produce substantially patterned glass articles, e.g., for covers, housings and enclosures of electronic devices. Aspects of the disclosure include methods of making these patterned articles, particularly with hydrofluoric acid-free processes. More generally, the approaches to preparing the patterned glass articles of the disclosure generate two or more textured regions that can be characterized by a difference in haze of at least 5% relative to one another. According to aspects of the patterning methods of the disclosure, the heterogeneous nature of the glass substrate allows the substrate to be selectively etched with one or more hydrofluoric acid-free etchants, leaving a porous silica-rich layer that can serve as a first textured region for the patterned glass article. Portions of the first textured region are covered with a mask, and the masked substrate is then subjected to a high pH etching step to reveal a second textured region. Upon removal of the mask, the resulting article has a patterned region that comprises the first and second textured regions, the first and second textured regions characterized by a difference in haze of at least 5%.

Referring to FIG. 1, a patterned glass article 100a is depicted as including a glass substrate 10 with a plurality of primary surfaces 12a and 14, a thickness 13 and a bulk composition at about the midpoint 13a of the thickness 13. In some embodiments, the bulk composition comprises about 40 mol % to 80 mol % silica. The patterned glass article 100a also includes a patterned region 30a with a composition having at least 40 mol % silica. In some embodiments, the patterned region 30a is formed from or otherwise part of the substrate 10, as shown in FIG. 1A. In such implementations, the patterned region 30a is defined between the primary surface 12a and a patterned region interface 34a within the substrate 10. Further, it should be understood that FIG. 1 is purposefully not drawn to scale to exaggerate features of importance. In particular, the patterned region 30a and compressive stress region 50 (described in detail below) are shown significantly larger in scale relative to the bulk region 40b (described in detail below), resulting in the midpoint 13a depicted closer to the primary surface 14 in the figure.

As generally depicted in FIG. 1, the patterned region 30a comprises a first textured region 21 and a second textured region 22, with the first and second textured regions 21, 22 characterized by a difference in haze of at least 5%. As such, implementations of the patterned region 30a of the disclosure are configured such that the first and second textured regions 21, 22 possess differing surface morphologies. As depicted in FIG. 1, the first textured region 21 includes a plurality of exposed features on its primary surface 12a with an average feature size 36a and an average roughness 38a. As also shown in FIG. 1, the second textured region 22 can possess a plurality of exposed features having an average feature size 37a and an average roughness 39a of a similar magnitude, or differing magnitude, as the respective average feature size 36a and average roughness 38a associated with the exposed features of the first textured region 21.

According to some implementations of the patterned glass article 100a depicted in FIG. 1, the exposed features of the first textured region 21 and/or the exposed features of the second textured region 22, including their respective average feature sizes and/or average roughness levels (e.g., elements 36a, 37a, 38a and 39a shown in FIG. 1), can each be configured to reduce the level of glare associated with the article 100a when it is employed in a display device. In other implementations, the exposed features of the first textured region 21 and/or the second textured region 22 can each be configured with particular morphologies (e.g., elements 36a, 37a, 38a and 39a shown in FIG. 1) to exhibit particular levels of haze. Accordingly, the first and second textured regions 21, 22 are characterized by a difference in haze of at least 5%.

Referring again to FIG. 1, the average feature size 36a, 37a of the exposed features of the first and second textured regions 21, 22 is given by an average of the maximum dimension of a sampling of features associated with the textured region 21, 22, as measured according to analytical techniques understood by those with ordinary skill in the field of this disclosure, for example, by taking an image of primary surface 12a with an atomic force microscope at 200× magnification and measuring the maximum dimension of a sampling of at least ten (10) features. Accordingly, the terms "average feature size" and "average maximum dimension" are used interchangeably in the disclosure. In some embodiments, the plurality of features in a textured region is configured such that each feature comprises one or more peaks and valleys. The "average maximum dimension" or "average feature size" of the exposed features is the greatest distance from a peak (or valley) of one feature to a peak (or valley) of an adjacent feature. For example, as shown in FIG. 1, the average feature size 36a and 37a of the textured regions 21 and 22, respectively, is the maximum distance between the peaks (or valleys) with the respective textured region, as measured in the plane of the primary surface 12a.

In embodiments, the average feature size 36a, 37a associated with the exposed features of the first and second textured regions 21, 22 of the patterned region 30a of the patterned glass article 100a is less than about 100 microns, with the average feature sizes 36a, 37a differing from one another. According to some implementations, the average feature sizes 36a and 37a associated with the exposed features of the first and second textured regions 21 and 22, respectively, are each less than about 100 microns, less than about 75 microns, less than about 50 microns, less than about 25 microns, less than about 10 microns, less than about 5 microns, less than about 1 micron, less than about 0.5 microns, less than about 0.1 microns, or any size between these values. Accordingly, implementations of the patterned glass article 100a can be configured such that the patterned region 30a includes a plurality of exposed features having an average feature size (e.g., as averaged from the average feature sizes 36a, 37a) from about 0.01 microns to about 100 microns, from about 0.01 microns to about 50 microns, from about 0.01 microns to about 10 microns, and all values between these limits, as measured in a plane defined by the primary surface 12a. Further, the average feature sizes 36a, 37a can each be less than about 100 microns, less than about 75 microns, less than about 50 microns, less than about 25 microns, less than about 10 microns, 9 microns, 8 microns, 7 microns, 6 microns, 5 microns, 4 microns, 3 microns, 2 microns, 1 micron, 0.9 microns, 0.8 microns, 0.7 microns, 0.6 microns, 0.5 microns, 0.4 microns, 0.3 microns, 0.2 microns, 0.1 microns, and all values between these values.

Referring again to the patterned region 30a of the patterned glass article 100a depicted in FIG. 1, the average roughness 38a of the first textured region 21 and the average roughness 39a of the second textured region 22 can be measured as surface roughness, $R_a$, using an interferometer and a sample area of 200 microns by 200 microns. The interferometer used was a ZYGO® NEWVIEW™ 7300 Optical Surface Profiler manufactured by ZYGO® Corporation. The surface roughness is reported as a mean surface roughness. In embodiments, the patterned glass article 100a can employ a patterned region 30a that includes a first and second textured region 21, 22 having an average roughness 38a, 39a from about 10 nanometers to about 1000 nanometers ($R_a$). According to some implementations, the average roughness 38a, 39a associated with the first and second textured regions 21, 22 is from about 10 nanometers to about 1000 nanometers ($R_a$), from about 20 nanometers to about 750 nanometers ($R_a$), from about 30 nanometers to about 500 nanometers ($R_a$), and all values between these levels of surface roughness. Further, in some implementations of the patterned glass article 100a, the patterned region 30a possesses first and second textured regions 21, 22 having an average roughness 38a, 39a from about 0.1 nanometers to about 500 nanometers ($R_a$), and all values between these levels of surface roughness.

Referring again to FIG. 1, the glass substrate 10 of the patterned glass article 100a is configured with a multi-component glass composition having about 40 mol % to 80 mol % silica and a balance of one or more other constituents, e.g., alumina, calcium oxide, sodium oxide, boron oxide, etc. In some implementations, the bulk composition of the glass substrate 10 is selected from the group consisting of aluminosilicate glass, a borosilicate glass and a phosphosilicate glass. In other implementations, the bulk composition of the glass substrate 10 is selected from the group consisting of aluminosilicate glass, a borosilicate glass, a phosphosilicate glass, a soda lime glass, an alkali aluminosilicate glass, and an alkali aluminoborosilicate glass. In further implementations, the glass substrate 10 is a glass-based substrate, including but not limited to, glass-ceramic materials that comprise a glass component at about 90% or greater by weight and a ceramic component.

In one embodiment of the patterned glass article 100a, the glass substrate 10 has a bulk composition that comprises an alkali aluminosilicate glass that comprises alumina, at least one alkali metal and, in some embodiments, greater than 50 mol %, $SiO_2$, in other embodiments, at least 58 mol %, and in still other embodiments, at least 60 mol % $SiO_2$, wherein the ratio ($Al_2O_3$ (mol %)+$B_2O_3$ (mol %))/Σ alkali metal modifiers (mol %)>1, where the modifiers are alkali metal oxides. This glass, in particular embodiments, comprises, consists essentially of, or consists of about 58 mol % to about 72 mol % $SiO_2$; about 9 mol % to about 17 mol % $Al_2O_3$; about 2 mol % to about 12 mol % $B_2O_3$; about 8 mol % to about 16 mol ° % $Na_2O$; and 0 mol % to about 4 mol ° % $K_2O$, wherein the ratio ($Al_2O_3$ (mol %)+$B_2O_3$ (mol %))/Σ alkali metal modifiers (mol %)>1, where the modifiers are alkali metal oxides.

In another embodiment of the patterned glass article 100a, as shown in FIG. 1, the glass substrate 10 has a bulk composition that comprises an alkali aluminosilicate glass comprising, consisting essentially of, or consisting of: about 61 mol % to about 75 mol % $SiO_2$; about 7 mol % to about 15 mol °.% $Al_2O_3$; 0 mol % to about 12 mol % $B_2O_3$; about 9 mol % to about 21 mol % $Na_2O$; 0 mol % to about 4 mol % $K_2O$; 0 mol % to about 7 mol % MgO; and 0 mol % to about 3 mol % CaO.

In yet another embodiment, the glass substrate 10 has a bulk composition that comprises an alkali aluminosilicate glass comprising, consisting essentially of, or consisting of: about 60 mol % to about 70 mol % $SiO_2$; about 6 mol % to about 14 mol % $Al_2O_3$; 0 mol % to about 15 mol % $B_2O_3$; 0 mol % to about 15 mol % $Li_2O$; 0 mol % to about 20 mol % $Na_2O$; 0 mol % to about 10 mol % $K_2O$; 0 mol % to about 8 mol % MgO; 0 mol % to about 10 mol % CaO; 0 mol % to about 5 mol % $ZrO_2$; 0 mol % to about 1 mol % $SnO_2$; 0 mol % to about 1 mol % $CeO_2$; less than about 50 ppm $As_2O_3$; and less than about 50 ppm $Sb_2O_3$; wherein 12 mol %≤$Li_2O$+$Na_2O$+$K_2O$≤20 mol % and 0 mol %≤MgO+Ca≤10 mol %.

In still another embodiment, the glass substrate 10 has a bulk composition that comprises an alkali aluminosilicate glass comprising, consisting essentially of, or consisting of: about 64 mol % to about 68 mol % $SiO_2$; about 12 mol % to about 16 mol % $Na_2O$; about 8 mol % to about 12 mol % $Al_2O_3$; 0 mol % to about 3 mol % $B_2O_3$; about 2 mol % to about 5 mol % $K_2O$; about 4 mol % to about 6 mol % MgO; and 0 mol % to about 5 mol % CaO, wherein; 66 mol %≤$SiO_2$+$B_2O_3$+CaO≤69 mol %; $Na_2O$+$K_2O$+$B_2O_3$+MgO+CaO+SrO>10 mol %; 5 mol %≤MgO+CaO+SrO≤8 mol %; ($Na_2O$+$B_2O_3$)—$Al_2O_3$≤2 mol %; 2 mol %≤$Na_2O$—$Al_2O_3$≤6 mol %; and 4 mol %/($Na_2O$+$K_2O$)—$Al_2O_3$≤10 mol %.

In other embodiments, the glass substrate 10 has a bulk composition that comprises $SiO_2$, $Al_2O_3$, $P_2O_5$, and at least one alkali metal oxide ($R_2O$), wherein 0.75>[($P_2O_5$ (mol %)+$R_2O$ (mol %))/$M_2O_3$ (mol %)]≤1.2, where $M_2O_3$=$Al_2O_3$+$B_2O_3$. In some embodiments, [($P_2O_5$ (mol %)+$R_2O$ (mol %))/$M_2O_3$ (mol %)]=1 and, in some embodiments, the glass does not include $B_2O_3$ and $M_2O_3$=$Al_2O_3$. The glass substrate comprises, in some embodiments: about 40 to about 70 mol % $SiO_2$; 0 to about 28 mol % $B_2O_3$; about 0 to about 28 mol % $Al_2O_3$; about 1 to about 14 mol % $P_2O_5$; and about 12 to about 16 mol % $R_2O$. In some embodiments, the glass substrate comprises; about 40 to about 64 mol % $SiO_2$; 0 to about 8 mol % $B_2O_3$; about 16 to about 28 mol % $Al_2O_3$; about 2 to about 12 mol % $P_2O_5$; and about 12 to about 16 mol % $R_2O$. The glass substrate 10 may further comprise at least one alkaline earth metal oxide such as, but not limited to, MgO or CaO.

In some embodiments, the glass substrate 10 has a bulk composition that is substantially free of lithium; i.e. the glass comprises less than 1 mol % $Li_2O$ and, in other embodiments, less than 0.1 mol % $Li_2O$ and, in other embodiments, 0.01 mol % Li$_2$O, and in still other embodiments, 0 mol % Li$_2$O. In some embodiments, such glasses are free of at least one of arsenic, antimony, and barium; i.e. the glass comprises less than 1 mol % and, in other embodiments, less than 0.1 mol %, and in still other embodiments 0 mol % of As$_2$O$_3$, Sb$_2$O$_3$, and/or BaO.

In other embodiments of the patterned glass article 100a, the glass substrate 10 has a bulk composition that comprises, consists essentially of or consists of a glass composition Corning® Eagle XG® glass, Corning® Gorilla® glass, Corning® Gorilla® Glass 2, Corning® Gorilla® Glass 3, Corning® Gorilla® Glass 4 or Corning® Gorilla® Glass 5.

As also depicted in FIG. 1, the patterned region 30a of the textured glass article 100a can comprise a porous leached layer 40a that spans between the primary surface 12a and the patterned region interface 34a of the glass substrate 10, the patterned region interface 34a defined as the transition between the bulk region 40b and the porous leached layer 40a. In some embodiments, the porous leached layer 40a comprises a higher amount of silica than the silica content in the bulk composition within the bulk region 40b of the glass substrate 10. As an example for purposes of illustration, a patterned glass article 100a with a glass substrate 10 possessing a bulk composition comprising about 50 mol % silica may include a patterned region 30a with a porous leached layer 40a possessing about 70 mol % silica. As will be outlined in greater detail below, the porous leached layer 40a can be created through a low pH treatment of the glass substrate 10. Such a treatment can preferentially remove non-silica components of the substrate 10, thus leaving a porous leached layer 40a with a higher silica content than in the bulk region 40b of the substrate 10 having the bulk composition.

According to some embodiments of the patterned glass article 100a depicted in FIG. 1, portions of the patterned region 30a can be characterized such that its composition is substantially equivalent to the bulk composition of the glass substrate 10, particularly with regard to silica content; and other portions of the patterned region 30a can be characterized such that its composition is substantially not equivalent to the bulk composition of the glass substrate 10, particularly with regard to silica content. As will be outlined in greater detail below, the patterned region 30b, as including the first and second textured regions 21, 22, can be created through successive low pH and high pH treatments to the glass substrate 10. The low pH treatment can preferentially remove non-silica components of the substrate 10, leaving a porous leached layer 40a (e.g., as shown in FIG. 1) with a higher silica content than the bulk composition of the substrate 10. As shown in FIG. 1, this porous leached layer 40a can define the first textured region 21. The subsequent high pH treatment, however, can be configured to remove the porous leached layer 40a in un-masked regions, and leave the porous leached layer 40a in masked portions associated with the first textured region 21 (not shown in FIG. 1, but shown and described in detail below with regard to FIG. 3). Accordingly, the removal of the porous leached layer 40a in certain regions can define the second textured region 22 of the patterned region 30a, with the second textured region 22 defined by the bulk region 40b and having about the same composition as the bulk composition of the glass substrate 10, particularly with regard to silica content.

As used herein, the terms "transmission haze" and "haze" refer to the percentage of transmitted light scattered outside an angular cone of about +2.5° in accordance with ASTM procedure D1003, entitled "Standard Test Method for Haze and Luminous Transmittance of Transparent Plastics," the contents of which is incorporated by reference herein in its entirety. For an optically smooth surface, transmission haze is generally close to zero. According to implementations of the patterned glass articles 100a (see FIG. 1), the articles can be characterized by a total haze from less than 100% to about 2.5%, recognizing that the first and second textured regions 21, 22 of the patterned region 30a differ by at least 5% in haze from one another. In implementations of the patterned glass article 100a, the article is characterized by a total haze of about 100%, 95%, 90%, 85%, 80%, 75%, 70%, 65%, 60%, 55%, 50%, 45%, 40%, 35%, 30%, 25%, 20%, 15%, 10%, 5%, all haze values between these levels.

According to an embodiment of the patterned article 100a depicted in FIG. 1, the first textured region 21 is characterized by a haze from about 0% to about 95% and the second textured region 22 is characterized by a haze from about 5% to about 100%, with the first and second textured regions 21, 22 exhibiting a difference in haze of about 5% or more. In embodiments, the first textured region 21 can be characterized by a haze level of about 95%, 90%, 85%, 80%, 75%, 70%, 65%, 60%, 55%, 50%, 45%, 40%, 35%, 30%, 25%, 20%, 15%, 10%, 5%, 0%, and all haze values between these levels. Similarly, the second textured region 22 can be characterized by a haze level of about 100%, 95%, 90%, 85%, 80%, 75%, 70%, 65%, 60%, 55%, 50%, 45%, 40%, 35%, 30%, 25%, 20%, 15%, 10%, 5%, and all haze values between these levels. According to embodiments of the patterned glass article 100a depicted in FIG. 1, the first and second textured regions 21 and 22 can be characterized by a difference in haze from about 5% to about 95%. As such, the second textured region 22 can be characterized by a haze that is more than the haze level of the first textured region 21 by about 5%, 10%, 15%, 20%, 25%, 30%, 35%, 40%, 45%, 50%, 55%, 60%, 65%, 70%, 75%, 80%, 85%, 90%, 95%, and all haze levels between these values.

In some implementations of the methods of the disclosure, desired haze levels in the first and second textured regions 21, 22 of the patterned region 30a of the patterned glass articles 100a can be obtained by controlling the etching and/or masking conditions associated with producing the respective textured regions 21, 22. In general, higher acid concentrations (for low pH etching steps), higher base concentrations (high pH etching steps) and/or etching times can increase the amount of haze associated with either or both of the textured regions 21, 22 of the patterned region 30a of the patterned glass article 100a.

According to other embodiments, the glass substrate 10 of the patterned glass articles 100a (see FIG. 1) can possess an ion-exchangeable glass composition that is strengthened by either chemical or thermal means that are known in the art. In one embodiment, the glass substrate is chemically strengthened by ion exchange. In this process, metal ions at or near a primary surface 12a, 14 of the glass substrate 10 are exchanged for larger metal ions having the same valence as the metal ions in the glass substrate. The exchange is generally carried out by contacting the glass substrate 10 with an ion exchange medium such as, for example, a molten salt bath that contains the larger metal ion. The metal ions are typically monovalent metal ions such as, for example, alkali metal ions. In one non-limiting example, chemical strengthening of a glass substrate 10 that contains sodium ions by ion exchange is accomplished by immersing the glass substrate 10 in an ion exchange bath comprising a molten potassium salt such as potassium nitrate (KNO$_3$) or the like. In one particular embodiment, the ions in the surface layer of the glass substrate 10 and the larger ions are monovalent alkali metal cations, such as Li$^+$ (when present in the glass), $Na^+$, $K^+$, $Rb^+$, and $Cs^+$. Alternatively, monovalent cations in the surface layer of the glass substrate 10 may be replaced with monovalent cations other than alkali metal cations, such as $Ag^+$ or the like.

In these embodiments, the replacement of small metal ions by larger metal ions in the ion exchange process creates a compressive stress region 50 (referred to as the "depth of layer") in the glass substrate 10 that extends from the primary surface 12a to a depth 52 (see FIG. 1) and/or from the other primary surface 14 to a depth (not shown) that is under compressive stress. This compressive stress at the primary surface of the glass substrate 10 is balanced by a tensile stress (also referred to as "central tension") within the interior of the glass substrate. In some embodiments, the primary surface 12a and/or 14 of the glass substrate 10 described herein, when strengthened by ion exchange, has a compressive stress of at least 350 MPa, and the region under compressive stress extends to a depth 52, i.e., depth of layer, of at least 15 μm below the primary surface 12a (and/or below the primary surface 14).

Ion exchange processes are typically carried out by immersing the glass substrate 10 in a molten salt bath containing the larger ions to be exchanged with the smaller ions in the glass. It will be appreciated by those skilled in the art that parameters for the ion exchange process, including, but not limited to, bath composition and temperature, immersion time, the number of immersions of the glass in a salt bath (or baths), use of multiple salt baths, additional steps such as annealing, washing, and the like, are generally determined by the composition of the glass and the desired depth of layer and compressive stress of the glass as a result of the strengthening operation. By way of example, ion exchange of alkali metal-containing glasses may be achieved by immersion in at least one molten bath containing a salt such as, but not limited to, nitrates, sulfates, and chlorides of the larger alkali metal ion. The temperature of the molten salt bath typically is in a range from about 380° C. up to about 450° C., while immersion times range from about 15 minutes up to about 16 hours. However, temperatures and immersion times different from those described above may also be used. Such ion exchange treatments, when employed with a glass substrate 10 having an alkali aluminosilicate glass composition, result in a compressive stress region 50 having a depth 52 (depth of layer) ranging from about 10 μm up to at least 50 μm with a compressive stress ranging from about 200 MPa up to about 800 MPa, and a central tension of less than about 100 MPa.

As the etching and leaching processes employed to create the first and second textured regions 21, 22 of the patterned region 30a can, in some instances, remove alkali metal ions from the glass substrate 10 that would otherwise be replaced by a larger alkali metal ion during an ion exchange process, a preference exists for developing a compressive stress region in the patterned glass article 100a after the formation and development of the patterned region 30a. Accordingly, in some embodiments, a compressive stress region is formed in the patterned glass article 100a after the formation and development of the patterned region 30a. In other embodiments, a compressive stress region can be developed in the glass substrate 10 prior to development of the patterned region 30a to a depth sufficient to account for some loss in the depth of layer in the compressive stress region that is associated with the low pH, or low and high pH treatments, as outlined below.

Figure 2:
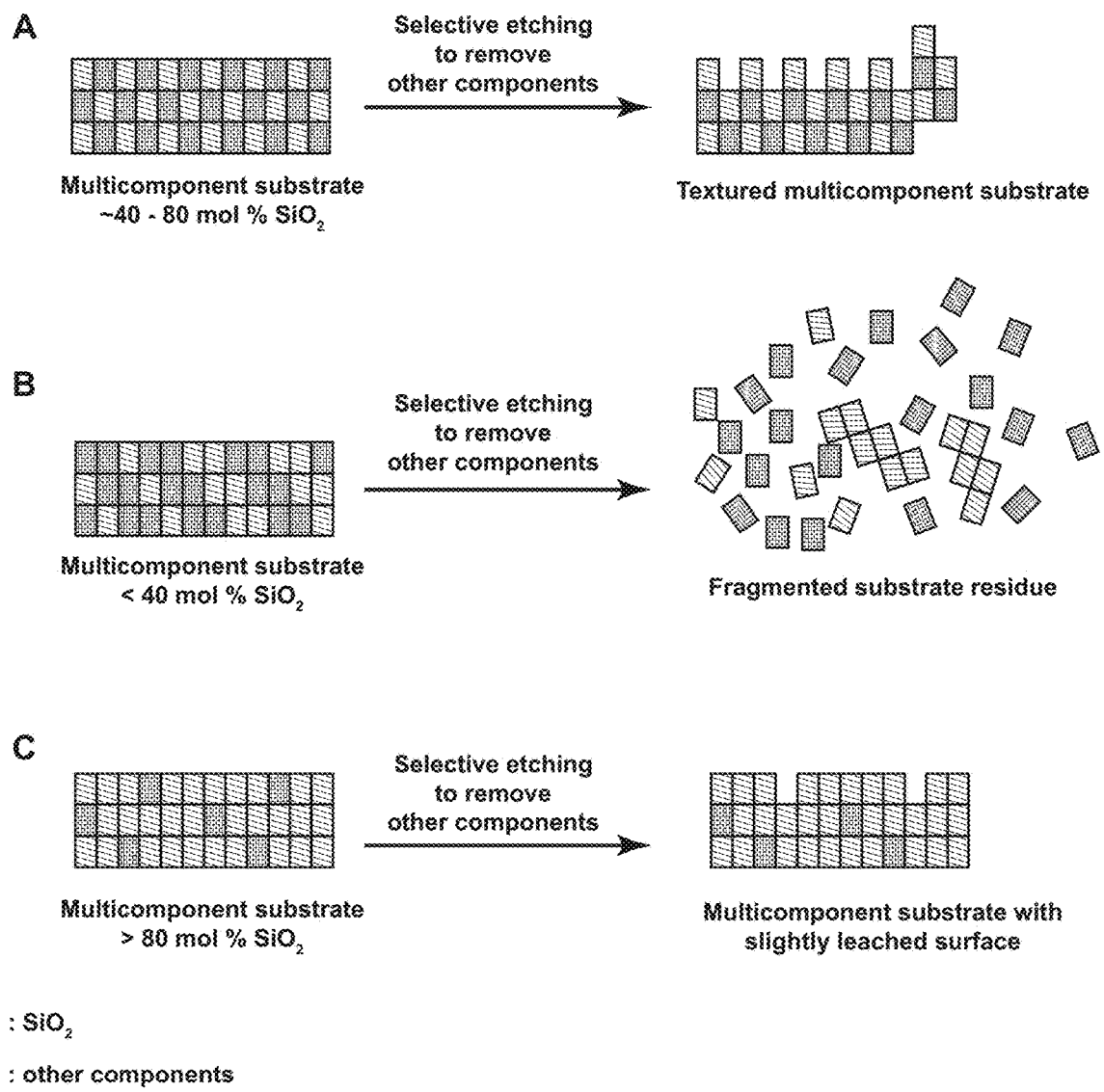
FIG. 2 is a schematic chart depicting the effects of leaching a silica-containing, multicomponent glass substrate with varying levels of silica.

Referring now to FIG. 2, a schematic chart depicts the effects of employing a low pH leaching process according to the disclosure to a silica-containing, multicomponent glass substrate (e.g., a glass substrate comparable to glass substrate 10) with varying levels of silica. In portion "A" of FIG. 2, a glass substrate with a composition having about 40 mol % to about 80 mol % silica is subjected to a low pH leaching process and non-silica components (denoted as "other components" in FIG. 2) are removed. The net result is a textured glass article with a textured region having a higher silica content than the bulk composition of the substrate. As shown in portion "A" of FIG. 2, the "textured multicomponent substrate" is comparable to the porous leached layer 40a of the patterned glass article 100a depicted in FIG. 1. In contrast, the portions "B" and "C" in FIG. 2 represent the effects of conducting the same low pH process with glass substrate compositions outside the preferred window in terms of silica content. That is, the substrate in portion "B" has a silica content of less than 40 mol %, and this substrate essentially falls apart or significantly degrades from the removal of the non-silica components during the low pH treatment. On the other hand, the substrate in portion "C" has a silica content of greater than 80 mol %, and the surface of this substrate is nearly indistinguishable from the surface of the substrate prior to etching; consequently, the substrate in portion "C" does not possess a textured region consistent with the principles of the disclosure after being subjected to the low pH treatment.

Figure 3:
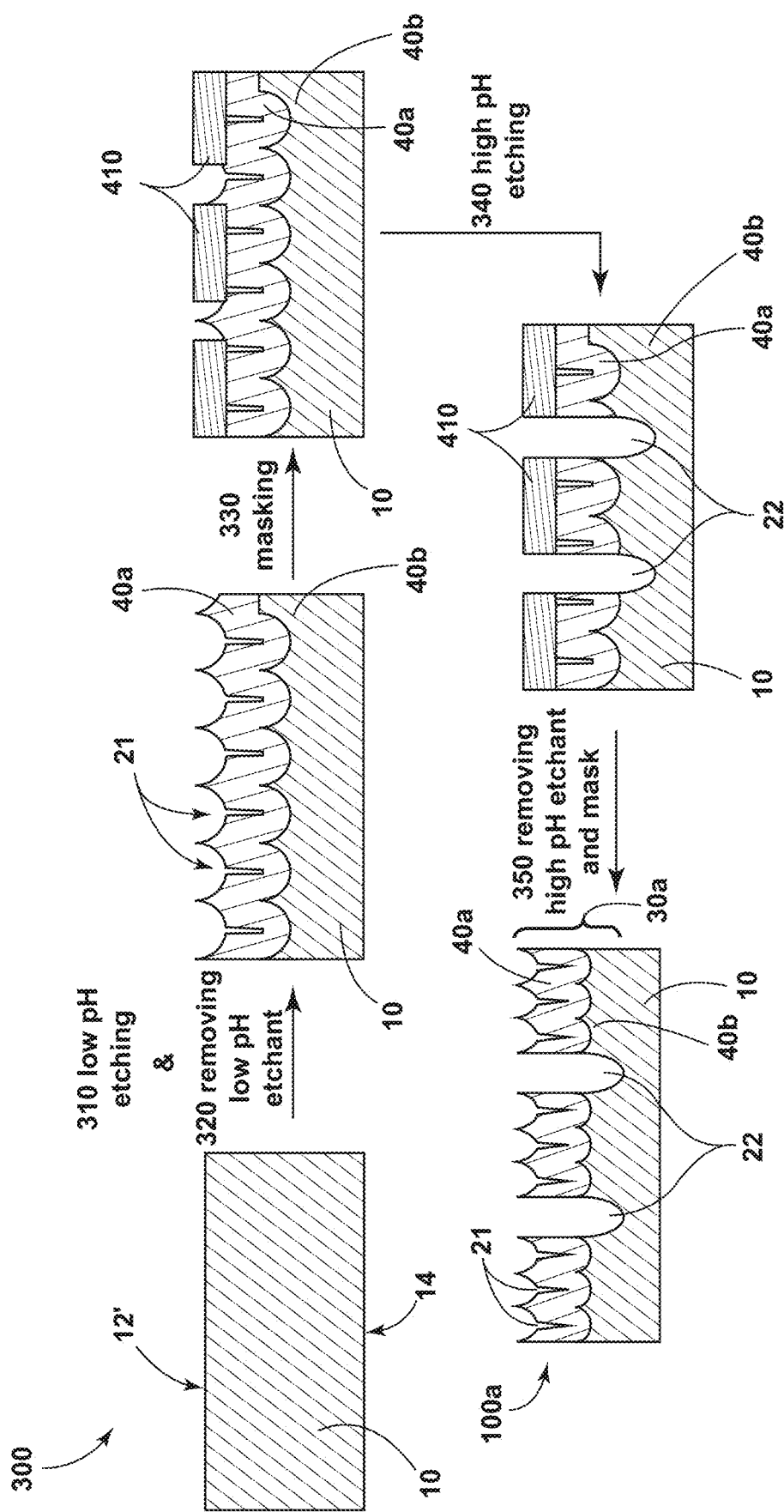
FIG. 3 is a schematic, flow chart depicting a method of making a patterned glass article as depicted in FIG. 1, according to an aspect of the disclosure.

Referring now to FIG. 3, a schematic, flow chart is provided that depicts a method 300 of making a patterned glass article, e.g., a patterned glass article 100a (as also depicted in FIG. 1). As shown, a glass substrate 10 is provided with an initial primary surface 12', along with an opposing primary surface 14. A low pH etching step 310 is then conducted to the substrate 10 that includes etching the initial primary surface 12' with a hydrofluoric acid-free etchant having a pH of about 3 or less. With further regard to the etching step 310, the step can include a metal ion leaching aspect (e.g., to remove alkali metals from the substrate 10) and a surface dissolution aspect (e.g., to remove silica from the substrate 10). In some embodiments of the method 300, the low pH etching step 310 can employ hydrochloric acid, silicic acid and/or citric acid as the hydrofluoric acid-free etchant. According to an embodiment, the etching step 310 is conducted at an elevated temperature from above ambient temperature to about 100° C. In some implementations, the etching step 310 is conducted at about 25° C., 30° C., 35° C., 40° C., 45° C., 50° C., 55° C., 60° C., 65° C., 70° C., 75° C., 80° C., 85° C., 90° C., 95° C., 100° C., 105° C., 110° C., and all temperatures between these values. Further, the etching step 310 can be conducted from about 15 minutes to about 100 hours. In some embodiments, the etching step 310 can be conducted from about 5 hours to about 30 hours. Suitable concentration levels for hydrochloric acid etchants, according to some implementations, range from about 0.5% to about 15% by weight, e.g., about 0.5%, 1%, 2%, 3%, 4%, 5%, 6%, 7%, 8%, 9%, 10%, 11%, 12%, 13%, 14%, 15%, and all concentrations of hydrochloric acid between these levels. Suitable concentration levels for citric acid etchants, according to other implementations, range from about 1% to 30% by weight, e.g., about 1%, 2%, 3%, 4%, 5%, 6%, 7%, 8%, 9%, 10%, 11%, 12%, 13%, 14%, 15%, 16%, 17%, 18%, 19%, 20%, 21%, 22%, 23%, 24%, 25%, 26%, 27%, 28%, 29%, 30%, and all concentrations of citric acid between these levels. Suitable concentration levels for silicic acid etchants, according to other implementations, range from about 1% to 30% by weight, e.g., about 1%, 2%, 3%, 4%, 5%, 6%, 7%, 8%, 9%, 10%, 11%, 12%, 13%, 14%, 15%, 16%, 17%, 18%, 19%, 20%, 21%, 22%, 23%, 24%, 25%, 26%, 27%, 28%, 29%, 30%, and all concentrations of citric acid between these levels.

According to another embodiment of the method 300 of making a patterned article 100a shown in FIG. 3 (e.g., a textured glass article 100a (as also depicted in FIG. 1)), the etching step 310 can include etching the initial primary surface 12' of the glass substrate 10 having a thickness 13 (as shown in FIG. 1) with a hydrofluoric acid-free etchant having a pH of about 3 or less and an additive salt. As used herein, the term "additive salt" comprises a salt comprising one or more of a multivalent metal cation (e.g., $Al^{3+}$), an ammonium cation (e.g., $NH_4^+$) and a metal cation not present or at a trace abundance in the glass substrate 10 (e.g., $Li^+$ for certain compositions of glass substrate 10). In some embodiments, the additive salt can comprise a multivalent metal ion and/or an ammonium ion, e.g., as selected from the group consisting of $NH_4^+$, $Al^{3+}$, $Fe^{3+}$, $Ca^{2+}$ and $Mg^{2+}$. For example, the additive salt can be $NH_4Cl$, $AlCl_3$, $FeCl_3$, $CaCl_2$) and $MgCl_2$. In some embodiments, the additive salt can also include salts comprising a cation not present or in a trace abundance within the target glass substrate 10, e.g., $NH_4Cl$, $LiCl$, $CsCl$, etc. According to some embodiments, the etching step 310 is conducted such that the additive salt (in addition to the hydrochloric acid-free etchant) is employed at a concentration from greater than about 0.1M to about 5M. According to some embodiments, the multivalent metal salt is employed in the etching step 310 at a concentration from greater than about 0.1M to about 3M, from about 0.1M to about 1.5M, from about 0.5M to about 2M, from about 0.5M to about 1.5M, and all concentration values between these range endpoints. In some implementations of the etching step 310 employing an additive salt, the etching is conducted at a temperature from about 75° C. to about 110° C., from about 80° C. to about 110° C., from about 85° C. to about 110° C., from about 90° C. to about 110° C., and all temperatures between these range endpoints. Advantageously, the incorporation of the additive salt into the etching step 310 can reduce the etching time needed to develop the desired level of haze and the porous leached region 40a (see also FIG. 1). According to some implementations of the etching step 310 employing an additive salt, the etching can be conducted from about 15 minutes to about 10 hours. In preferred implementations, the etching step 310 can be conducted with an additive salt from about 15 minutes to about 5 hours, from about 30 minutes to about 5 hours, or even from about 30 minutes to 2 hours.

Referring again to FIG. 3, in some embodiments, the method 300 further includes a removing step 320 configured to remove excess etchant, optional additive salt(s) and leached substrate constituents from the etching step 310. That is, after step 310 of the method 300, a removing step 320 can be conducted to remove excess etchant, along with any constituents from the initial primary surface 12' of the substrate 10, by rinsing the etchant on the initial primary surface 12' with deionized water. As would be understood by those with ordinary skill in the field of the disclosure, various mechanical and/or aqueous cleaning approaches can be employed in the removing step 320 to remove excess etchant and leached substrate constituents without materially affecting the surface of the substrate 10. Upon completion of the etching step 310 and optional step 320 for removing the low pH etchant, a porous leached layer 40a is revealed having a different compositional make up from the bulk region 40b, which can define the first textured region 21 of the substrate 10.

In embodiments, the etching step 310 of the method 300 shown in FIG. 3 is associated with a low pH leaching aspect, and a low pH surface dissolution and differential leaching aspect. Without being bound by theory, the low pH leaching aspect of the low pH etching step 310 occurs during an initial period during the etching and results in leaching of non-silica constituents from the substrate 10. According to some embodiments, the low pH leaching aspect can be represented by the following reaction ("Reaction 1"): $M^{x+}$ (in glass substrate)→$M^{x+}$ (etchant), where M represents metal ions leaching from the glass substrate 10 into the etchant, and x equals an integer. As crevices and other high depth features are created in the initial primary surface 12' of the glass substrate 10 during the low pH leaching aspect of the etching step 310, preferential removal of additional non-silica constituents occurs to the glass substrate in these crevice regions (e.g., at a higher leaching rate than surrounding material) during the differential leaching aspect, leading to the additional development of features below the porous leached layer 40a. According to some embodiments, the differential leaching aspect can be represented by the following reaction ("Reaction 2"), which describes silica layer dissolution at the surface of the glass substrate 10: $(SiO_2)n$ (in glass substrate)+2n $H_2O$→n $H_4SiO_4$ (i.e., silicic acid formed within the etchant), where n is an integer. It is also believed that the foregoing reaction can proceed in reverse, with silicic acid precipitating out as $SiO_2$ within the etchant ("Reaction 3"). As the concentration of silicic acid is reduced in Reaction 3, Reactions 1 and 2 are not rate-limited and can continue, facilitating the etching process to obtain the porous leached region 40a. As such, the porous leached region 40a formed during the low pH etching step 310 can have multiple morphologies, e.g., at the primary surface 12a and at the interface 34a between the leached layer 40a and the underlying substrate 10 (see FIG. 1).

Without being bound by theory, the rate of formation of the porous leached region 40a according to the method 300 can be accelerated or decelerated by controlling aspects of the foregoing Reactions 1, 2 and/or 3. For example, a reduction in the amount of water employed in the etchant can slow Reaction 2 (e.g., by adding a water-soluble organic solvent) and, accordingly, the rate at which method 300 proceeds. Similarly, adding silicic acid to the etchant can also slow Reaction 2 which, in turn, will slow the rate at which method 300 proceeds. According to some embodiments of the method 300, as noted above, the etching step 310 can also employ an additive salt. In particular, the additive salt can serve as a catalyst in Reaction 3. That is, the additive salt (inclusive of $NH_4Cl$) will accelerate Reaction 3 such that the silicic acid precipitates, re-nucleates and/or polymerizes in the etchant, thus reducing the concentration of silicic acid in the etchant. As a consequence, the reduction in silicic acid in the etchant should allow for the acceleration of Reaction 1, thus accelerating the overall rate of formation of the porous leached region 40a according to the method 300. According to another implementation, each of the Reactions 1, 2 and 3 can be accelerated by increasing the reaction temperature, up to about 100° C. Finally, it is also possible to slow Reaction 1 by incorporating metal ions of the glass substrate 10 into the etchant (e.g., $Li^+$, $Na^+$, and $K^+$).

As shown in FIG. 3, a schematic, flow chart is provided that further depicts a method 300 of making a patterned glass article, e.g., a patterned glass article 100a (as also depicted in FIG. 1). More particularly, the completion of the etching step 310 of the method 300, and removing step 320, if applicable, results in an interim textured glass article having a porous leached region 40a and a bulk region 40b (e.g., as comparable to the patterned glass article 100a shown in FIGS. 1 and 3). Notably, the porous leached region 40a defines the first textured region 21, as shown in FIG. 3. At this point, the method 300 continues with a step 330 of masking a portion of the porous leached region 40a of the interim textured glass article with a mask 410 to define a masked surface. In some embodiments, the mask 410 is a carbon-based acrylate, photo-resist material, or another polymeric material suitable for blocking the high pH etchant in subsequent steps of the method 300 from reaching those portions of the porous leached region 40a beneath the mask 410. In some aspects, the masking step 330 is conducted with an inkjet printing process to deposit and form the mask 410 over the desired portions of the porous leached region 40a.

After the masking step 330 is completed, the method 300 continues with a high pH etching step 340. More particularly, the high pH etching step 340 is conducted by treating the porous leached region 40a between, or otherwise adjacent to, the masks 410 located over portions of the leached region 40a with a high pH etchant. Further, the high pH etching step 340 can be conducted with a high pH etchant having a pH of about 10.0 or greater to etch away a portion of the porous leached region 40a and define a second textured region 22, as shown in FIG. 3. In particular, the porous leached region 40a adjacent to the masks 410 is removed during the treating step 340, leaving the exposed portions of the bulk region 40b that define the second textured region 22 of the substrate 10.

According to some embodiments of the method 300, the etchant employed during the step 340 is an aqueous, alkaline solution having a pH that ranges from about 10 to about 13. Suitable high pH etchants include KOH, NaOH, and $NH_4OH$, each of which can be employed singly or in combination with one another at a total concentration, by weight, from about 0.1% to about 20%, from about 0.1% to about 10%, from about 0.1% to about 5%, and all concentration values between these levels. Further, in some implementations, the high pH etching step 340 can be conducted with KOH at a concentration, by weight, of about 0.1%, 0.5%, 1%, 2%, 3%, 4%, 5%, 6%, 7%, 8%, 9%, 10%, 15%, 20%, and all concentration values between these amounts.

Referring again to FIG. 3, the method 300 concludes with a step 350 for removing the high pH etchant and mask 410. In particular, the removing step 350 is configured to remove excess high pH etchant and the masks 410. That is, after the high pH etching step 340 of the method 300, the removing step 350 is conducted to remove excess high pH etchant and the masks 410 with deionized water, preferably at an elevated temperature not exceeding 150° C. As would be understood by those with ordinary skill in the field of the disclosure, various mechanical and/or aqueous cleaning approaches can be employed in the removing step 350 to remove excess high pH etchant, masks 410 and any leached and/or dissolved substrate constituents from the prior steps of the method 300 without materially affecting the surface of the substrate 10. Upon completion of the high pH etching step 340 and removing step 350, the patterned region 30a of the patterned glass article 100a is revealed. As shown in FIG. 3 (and also FIG. 1), the patterned region 30a includes a first textured region 21 (i.e., as defined by the porous leached region 40a) and a second textured region 22 (i.e., as defined by the underlying bulk region 40b). As such, the method 300 depicted in FIG. 3 can be employed to produce various patterned glass articles consistent with the principles of the disclosure, including the patterned glass article 100a (see also FIG. 1).

Figure 4A:
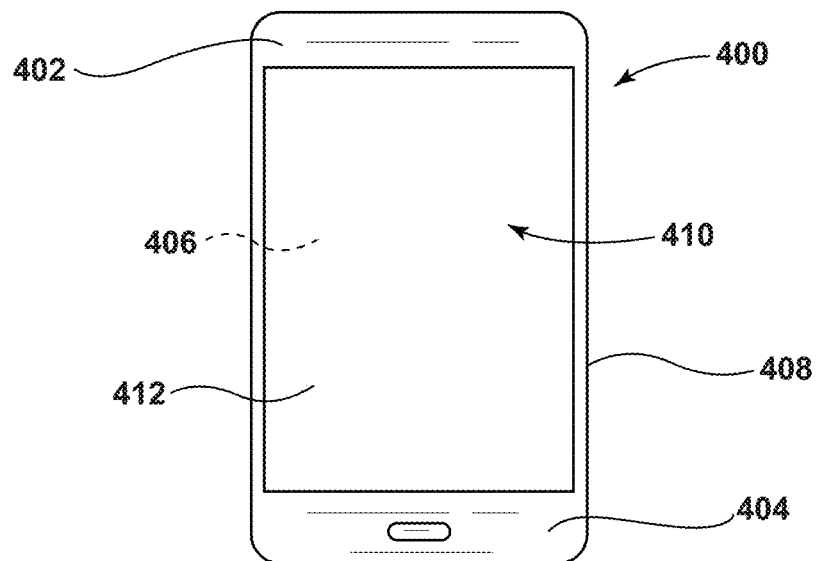
FIG. 4A is a plan view of an exemplary electronic device incorporating any of the articles disclosed herein.
Figure 4B:
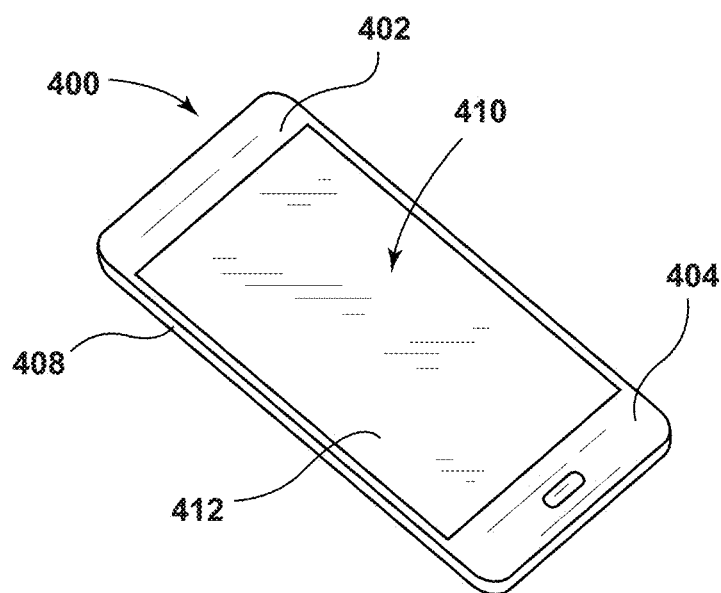
FIG. 4B is a perspective view of the exemplary electronic device of FIG. 4A.
Figure 5A:
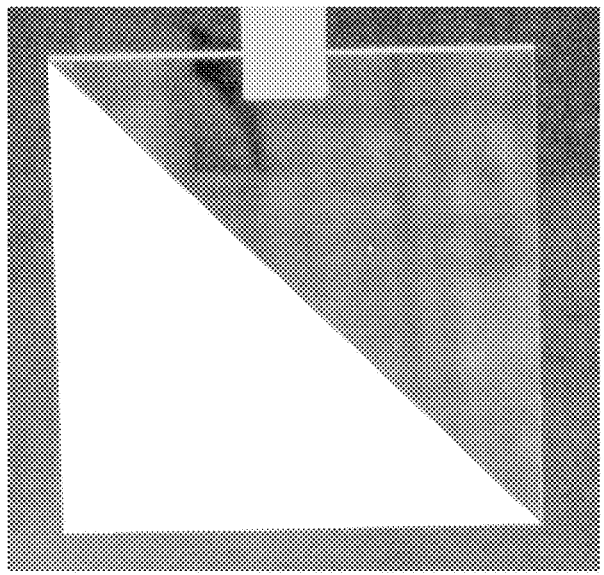
FIGS. 5A-5D are optical micrographs of textured regions of patterned glass articles with varying levels of initial haze levels prior to masking, according to an aspect of the disclosure.
Figure 5B:
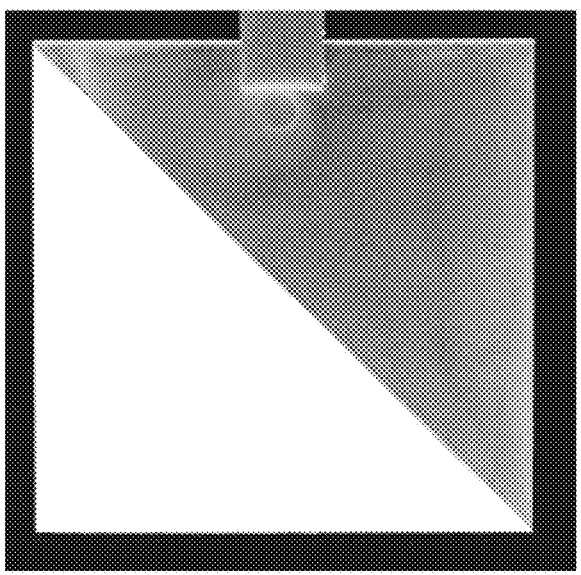
Figure 5C:
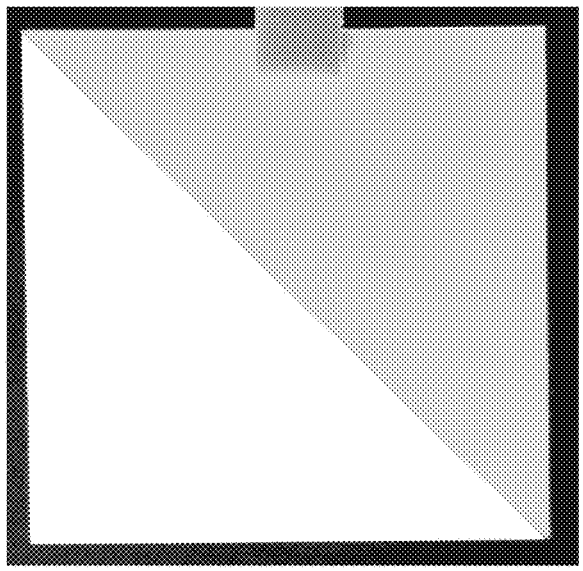
Figure 5D:
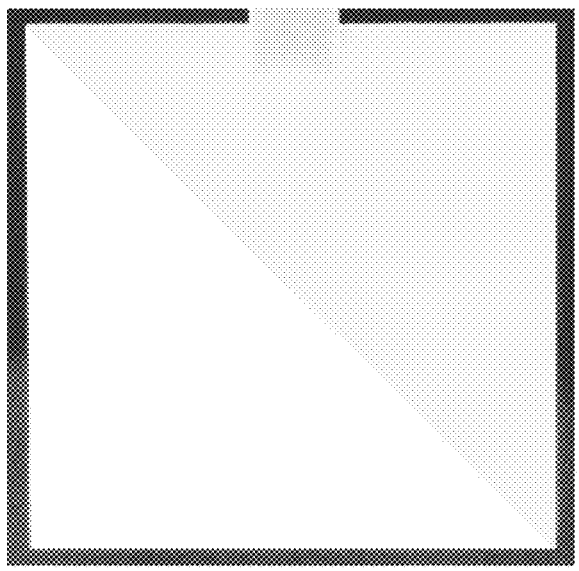

The patterned glass articles disclosed herein, e.g., patterned glass articles 100a, may be incorporated into another article such as an article with a display (or display articles) (e.g., consumer electronics, including mobile phones, tablets, computers, navigation systems, and the like), architectural articles, transportation articles (e.g., automotive, trains, aircraft, sea craft, etc.), appliance articles, or any article that requires some transparency, scratch-resistance, abrasion resistance or a combination thereof. An exemplary article incorporating any of the glass articles disclosed herein, including patterned glass articles 100a, is shown in FIGS. 4A and 4B. Specifically, FIGS. 4A and 4B show a consumer electronic device 400 including a housing 402 having front 404, back 406, and side surfaces 408; electrical components (not shown) that are at least partially inside or entirely within the housing and including at least a controller, a memory, and a display 410 at or adjacent to the front surface of the housing; and a cover substrate 412 at or over the front surface of the housing such that it is over the display. In some embodiments, at least one of the cover substrate 412 or a portion of housing 402 may include any of the patterned glass articles disclosed herein.

EXAMPLES

The following examples describe various features and advantages provided by the disclosure, and are in no way intended to limit the invention and appended claims.

Example 1

Samples of Glass 1 were treated as described below. The samples were not ion exchanged. Glass 1 had an approximate composition on an oxide basis of 63.76 mol % $SiO_2$; 2.37 mol % $B_2O_3$; 15.05 mol % $Al_2O_3$; 9.24 mol % $Na_2O$; 5.88 mol % $Li_2O$; 1.18 mol % ZnO; 2.47 mol % $P_2O_5$; and 0.05 mol % $SnO_2$. All samples were subjected to a low pH etching step consistent with the methods of the disclosure. In particular, the samples were divided into four (4) groups, with each group being exposed to 20 wt. % citric acid with a 1M $AlCl_3$ salt additive for 90 minutes, 110 minutes, 140 minutes or 180 minutes at an etching temperature of ~100° C. As a result of this etching step, the four groups developed a porous leached region having respective initial haze levels of 1%, 5%, 50% and 90% (i.e., as shown in the upper-right triangular region of the samples shown in FIGS. 5A-5D, respectively). The samples from all of the groups were then subjected to a step of removing the low pH etchant with deionized water. At this point, the upper-right portions (i.e., with the initial haze levels noted above) of the porous leached regions of the samples were masked according to an ink-jet masking step consistent with the methods of the disclosure. The samples were then subjected to a high pH etching step (i.e., the lower-left portions shown in FIGS. 5A-5D as the upper-right portions were masked). In particular, the samples were etched with a Semiclean KG detergent (KOH) at a concentration of 4%, by weight, at room temperature for about 10 minutes. The basic Semiclean KG detergent (KOH) and masks on the samples were then cleaned with an above-ambient temperature wash with deionized water, thus forming patterned glass articles.

Referring to FIGS. 5A-5D, optical micrographs are provided of the textured regions of the patterned glass articles of this example. The initial haze level associated with the porous leached region (i.e., initial haze levels of 1%, 5%, 50% and 90%, respectively, for FIGS. 5A-5D) is indicative of the appearance of the upper right corner of each sample. This is because this region was masked prior to the initiation of the high pH etching step. As such, the lower left corner of each sample is indicative of the higher haze levels in the non-masked portions subjected to the high pH etchant. It is evident that the contrast between the upper right and lower left corner of each of the figures is indicative of the difference in haze levels between these regions, as also exemplary of the first and second textured regions of the patterned region of the patterned glass articles of the disclosure.

Example 2

Figure 6:
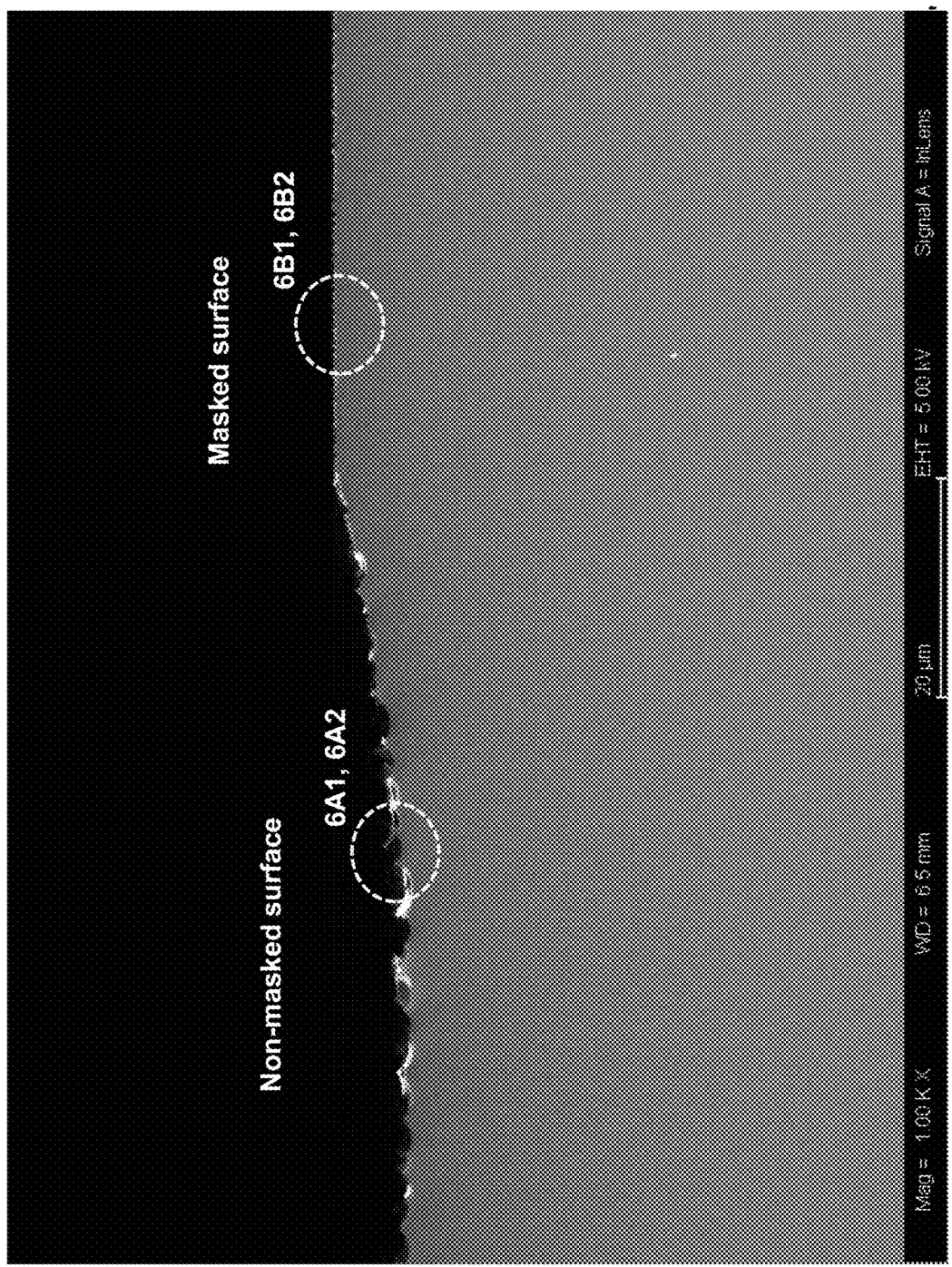
FIG. 6 is an SEM micrograph of a cross-section of a patterned glass article showing non-masked and masked surfaces (i.e., first and second textured regions), according to an aspect of the disclosure.

In this example, the region between the masked and non-masked regions in one of the samples from Example 1 was analyzed with a scanning electron microscope (SEM). Referring to FIG. 6, an SEM micrograph is provided of a cross-section of one of the patterned glass articles from Example 1 that shows its non-masked and masked surfaces at high magnification (i.e., first and second textured regions). From this figure, it is evident that the morphologies of the non-masked and masked surfaces differ, with the non-masked surface appearing to have higher roughness levels.

Referring now to FIGS. 6A1 and 6A2, these SEM micrographs are enlarged views of the non-masked surface of the patterned article sample depicted in FIG. 6, with each view having a different level of magnification. Similarly, FIGS. 6B1 and 6B2 are SEM micrographs of enlarged views of the masked surface of the same sample shown in FIG. 6, at the same respective magnification levels as shown in FIGS. 6A1 and 6A2. As is evident from FIGS. 6A1, 6A2, 6B1 and 6B2, and is also consistent with the lower magnification view in FIG. 6, the non-masked surface of these articles exhibits a significantly higher degree of surface roughness than the surface roughness observed for the masked region at each of the two magnifications associated with these figures. Without being bound by theory, it is believed that the differing morphologies observed with the masked and non-masked regions of the patterned articles is manifested in differing levels of haze measured in these regions. Further, these differing morphologies between the two regions can define a single patterned region with an appreciable level of haze contrast (i.e., Δ haze).

Example 3

Samples of Glass 1 were treated as described below in this example. The samples were not ion exchanged. All samples were subjected to a low pH etching step consistent with the methods of the disclosure. In particular, each of the samples was exposed to boiling citric acid (at ~100° C.) at a concentration level, by weight, of 20% with a 1M $AlCl_3$ salt additive for varying etching times as listed below in Table 1 (i.e., from 60 minutes to 200 minutes) to produce the listed initial haze levels (i.e., Sample Nos. 1-15 with haze levels from 0% to about 95.54%). As is evident from Table 1, the samples etched for 60 and 70 minutes, respectively, produced no measurable initial haze levels.

The samples were then subjected to a step of removing the low pH etchant with deionized water at 110° C., followed by one hour of drying. At this point, portions of the samples (i.e. the samples that were previously etched to an initial haze level with the low pH etching step) were masked with an ink-jet process. The samples were then subjected to a high pH etching step. In particular, the samples were etched with a Semiclean KG detergent (KOH) at a concentration of 4%, by weight, at room temperature for about 10 minutes. The excess detergent (KOH) and masks on the samples were then cleaned with an above-ambient temperature wash with deionized water, thus forming patterned glass articles. Upon removal of the mask, the haze levels of the masked and non-masked areas was measured, as also reported below in Table 1. Differences in the haze levels between the masked and non-masked areas is also reported in Table 1 as "Δ haze (%)".

As is evident from Table 1, increasing the etching time in the low pH etching step tended to increase the initial haze levels accordingly for Sample Nos. 1-15. For example, an etching time of 110 minutes in Sample No. 6 produced an initial haze of 4.69%. As another example, an etching time of 140 minutes in Sample No. 9 produced an initial haze of 53.51%. Further, it is also evident that the haze levels of Sample Nos. 1-15 in the masked regions after the high pH etching step (as observed after removal of the masks) are very similar to the initial haze values. Without being bound by theory, it is believed that high pH etching step does not significantly affect the surface of the porous leached region beneath the masks, thus resulting in minimal change in the haze levels for this region before and after the high pH etching step. Further, the masked region is consistent and exemplary of the first textured region 21 in the patterned glass articles 100a of the disclosure (see FIG. 1). In contrast, the haze levels in the non-masked region are higher than those observed in the masked region. Again, without being bound by theory, it is believed that the high pH etching step tends to change the morphology of the surface further, including removing the porous leached region adjacent to the masks. The net result is that the non-masked regions tend to have higher haze levels than the non-masked regions. Further, the non-masked region is consistent and exemplary of the second textured region 22 of the patterned glass articles 100a of the disclosure. Finally, it is also evident from Table 1 that the difference in haze contrast between the masked and non-masked regions tends to exceed 10% for samples with initial haze levels of more than 5% and less than 90%. Further, a peak difference in haze contrast (i.e., Δ haze) of about 54.5% is evident for Sample No. 7, which was etched with a low pH etchant for 120 minutes to obtain an initial haze of 10.52%. Hence, it seems that haze contrast, which is a measure of the degree of patterning associated with a patterned article can be influenced strongly by the conditions chosen in the initial, low pH etching step.

TABLE 1

| Sample No. | Low pH etching time (min) masked region | Initial Haze (%) | Haze (%) after high pH etching Masked region | Haze (%) after high pH etching Non-masked region | Δ Haze (%) |
|---|---|---|---|---|---|
| 1 | 60 | 0 | 0 | 2.33 | 2.33 |
| 2 | 70 | 0 | 0.01 | 6.54 | 6.53 |
| 3 | 80 | 0.18 | 0.21 | 13.66 | 13.45 |
| 4 | 90 | 0.84 | 0.89 | 23.34 | 22.45 |
| 5 | 100 | 2.81 | 2.69 | 41.49 | 38.8 |
| 6 | 110 | 4.69 | 5.23 | 49.31 | 44.08 |
| 7 | 120 | 10.52 | 11.16 | 65.68 | 54.52 |
| 8 | 130 | 27.99 | 36.05 | 70.73 | 34.68 |
| 9 | 140 | 53.51 | 57.09 | 84.34 | 27.25 |
| 10 | 150 | 62.26 | 67.3 | 91.8 | 24.5 |
| 11 | 160 | 72.9 | 74.44 | 95.19 | 20.75 |
| 12 | 170 | 81.43 | 81.27 | 97.51 | 16.24 |
| 13 | 180 | 90.76 | 92.05 | 100 | 7.95 |
| 14 | 190 | 92.64 | 92.08 | 100 | 7.92 |
| 15 | 200 | 95.54 | 94.19 | 100 | 5.81 |

Figure 7A:
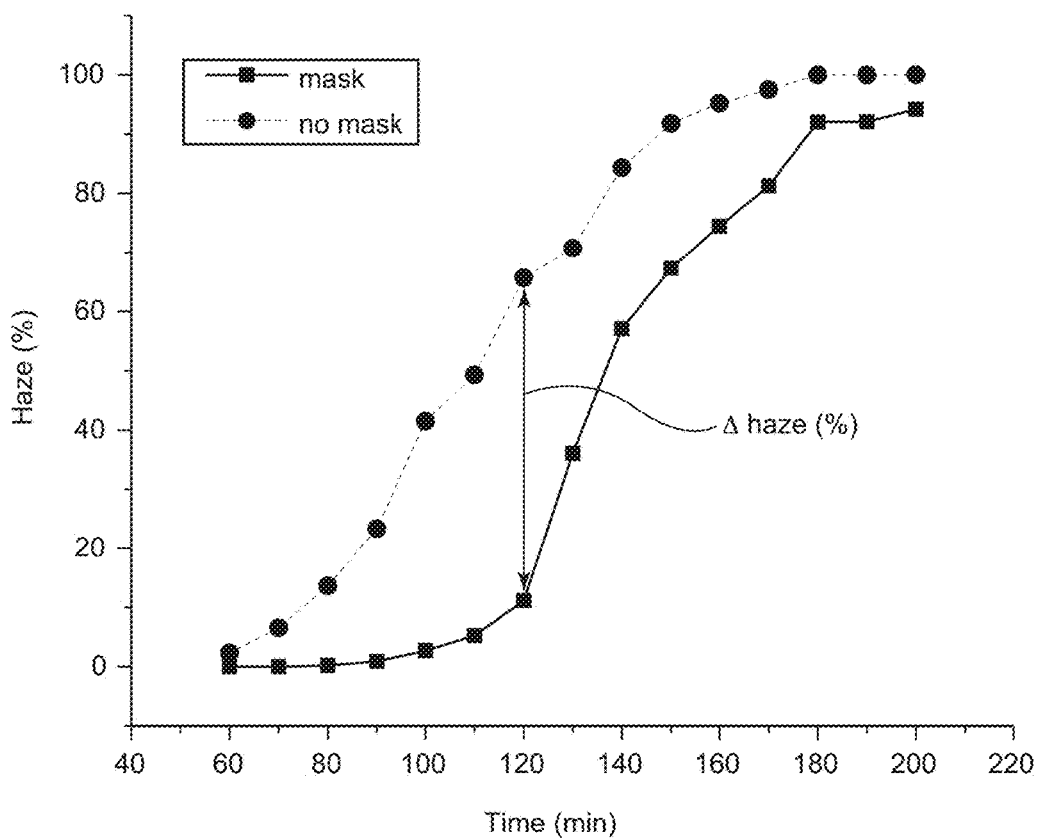
FIG. 7A is a plot of initial and final haze levels vs. etching time for patterned glass articles fabricated according to methods of the disclosure.

Referring now to FIG. 7A, a plot is provided of the data listed above in Table 1. In particular, FIG. 7A is a plot of the haze levels in the masked and unmasked portions vs. etching time for patterned glass articles fabricated according to this example according to the process details noted above. From this plot, it can be observed that the haze level of the non-masked area of the samples significantly increases relative to the haze level in the masked region after completion of the high pH etching step. Without being bound by theory, it is believed that the high pH etching step tends to remove the small exposed features present in the porous leached layer that results from the earlier low pH etching step. Further, as noted above, the haze contrast between the masked and non-masked regions can be managed, in part, based on process conditions to produce initial haze values within particular ranges.

Figure 7B:
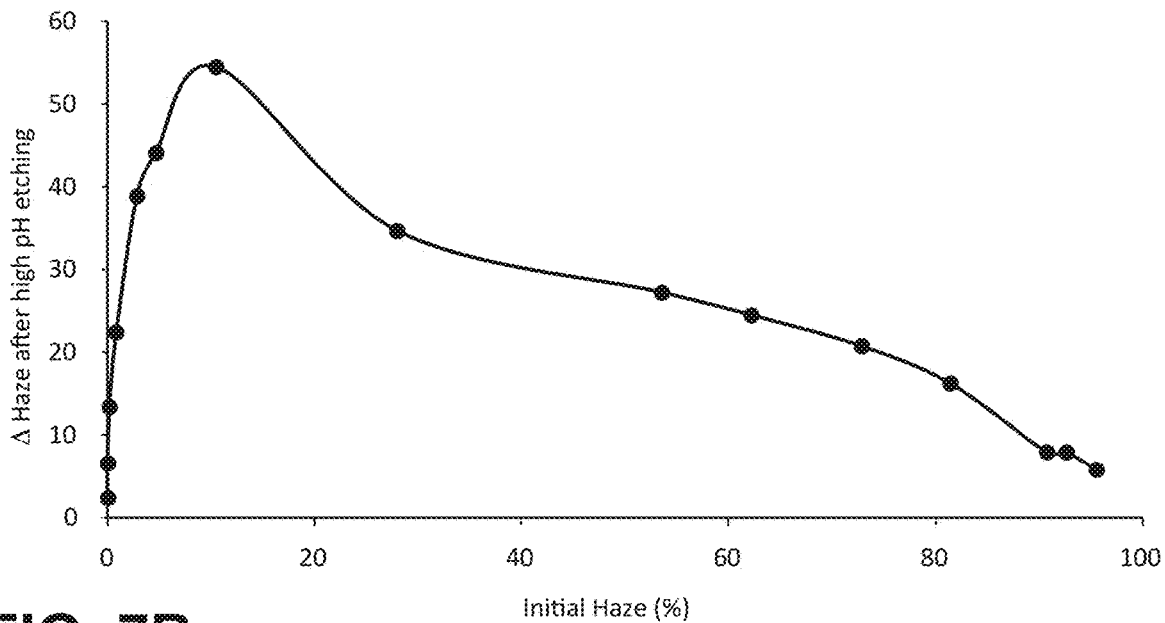
FIG. 7B is a plot of final haze contrast levels (Δ haze) after a final high pH etching step vs. initial haze levels prior to the high pH etching step for the patterned glass articles depicted in FIG. 7A.

Referring now to FIG. 7B, a plot is provided of final haze contrast levels (Δ haze) after a final high pH etching step vs. initial haze levels prior to the high pH etching step for the patterned glass articles depicted in FIG. 7A. As is evident from this figure, peak haze contrast values of about 55% were achieved for the samples having an initial haze of about 11%, with relatively high haze contrast values that exceed 35% can be obtained for samples having an initial haze from about 2.8% to about 28%. While the haze values in this example were tailored based on varying etching time, it is also possible according to the methods of the disclosure, to adjust initial haze levels by varying low pH etchant concentration, the choice of the low pH etchant and/or the etching temperature. In addition, the composition of the substrate 10 can also be adjusted to increase or decrease initial haze levels under the same processing conditions, e.g., lower $SiO_2$ levels in the glass substrate can tend to result in higher initial haze levels.

Many variations and modifications may be made to the above-described embodiments of the disclosure without departing substantially from the spirit and various principles of the disclosure. All such modifications and variations are intended to be included herein within the scope of this disclosure and protected by the following claims.

What is claimed is:

1. A patterned glass article, comprising:
    a glass substrate comprising a thickness, a primary surface and a bulk composition at the midpoint of the thickness; and
    a patterned region defined by the primary surface and comprising a patterned region composition,
    wherein the bulk composition comprises about 40 mol % to 80 mol % silica and the patterned region composition comprises at least about 40 mol % silica, and
    further wherein the patterned region comprises a first textured region and a second textured region, the second textured region characterized by a second haze of at least 5% more than a first haze of the first textured region.

2. The article according to claim 1, wherein the patterned region further comprises a surface roughness ($R_a$) from about 10 nanometers to about 1000 nanometers.

3. The article according to claim 1, wherein the bulk composition is selected from the group consisting of an aluminosilicate glass, a borosilicate glass, and a phosphosilicate glass.

4. The article according to claim 1, wherein the glass substrate further comprises a compressive stress region that extends from the primary surface to a selected depth.

5. The article according to claim 1, wherein the second textured region is characterized by the second haze of at least 15% more than the first haze of the first textured region.

6. A consumer electronic product, comprising:
    a housing having a front surface, a back surface and side surfaces;
    electrical components provided at least partially within the housing, the electrical components including at least a controller, a memory, and a display, the display being provided at or adjacent the front surface of the housing; and
    a cover glass disposed over the display,
    wherein at least one of a portion of the housing or the cover glass comprises the article of claim 1.

7. A patterned glass article, comprising:
    a glass substrate comprising a thickness, a primary surface and a bulk composition at the midpoint of the thickness; and
    a patterned region defined by the primary surface and comprising a patterned region composition,
    wherein the bulk composition comprises about 40 mol % to 80 mol % silica and the patterned region composition comprises at least about 40 mol % silica, and
    wherein the patterned region comprises a first textured region and a second textured region, the second textured region characterized by a second haze of at least 5% more than a first haze of the first textured region, and
    further wherein the patterned region comprises a plurality of exposed features having an average maximum dimension from about 0.01 microns to about 100 microns in a plane defined by the primary surface.

8. The article according to claim 7, wherein the patterned region further comprises a surface roughness ($R_a$) from about 10 nanometers to about 1000 nanometers.

9. The article according to claim 7, wherein the bulk composition is selected from the group consisting of an aluminosilicate glass, a borosilicate glass, and a phosphosilicate glass.

10. The article according to claim 7, wherein the glass substrate further comprises a compressive stress region that extends from the primary surface to a selected depth.

11. The article according to claim 7, wherein the second textured region is characterized by a haze of at least 15% more than a haze of the first textured region.

12. The article according to claim 7, wherein the patterned region comprises a plurality of exposed features having an average maximum dimension from about 0.01 microns to about 10 microns in a plane defined by the primary surface.

13. A consumer electronic product, comprising:
    a housing having a front surface, a back surface and side surfaces;
    electrical components provided at least partially within the housing, the electrical components including at least a controller, a memory, and a display, the display being provided at or adjacent the front surface of the housing; and
    a cover glass disposed over the display,
    wherein at least one of a portion of the housing or the cover glass comprises the article of claim 7.

14. The article according to claim 1, wherein the first haze of the first textured region is at least 10%.

15. The article according to claim 1, wherein the surface roughness ($R_a$) of the patterned region ranges from about 50 nanometers to about 500 nanometers.

16. The article according to claim 7, wherein the primary surface comprises a porous, leached layer over which peaks of the exposed features are formed.

17. The article according to claim 16, wherein exposed features comprise a plurality of valleys that extend from the primary surface and into a bulk region of the bulk composition.

18. The article according to claim 7, wherein the surface roughness ($R_a$) of the pattered region ranges from about 50 nanometers to 500 nanometers.

* * * * *